United States Patent [19]

Dujardin

[11] Patent Number: 4,980,770
[45] Date of Patent: Dec. 25, 1990

[54] LOGIC SIGNALS GENERATING AND SEQUENCING CIRCUIT FOR CHARGE TRANSFER DEVICE

[75] Inventor: Stéphane Dujardin, Menucourt, France

[73] Assignee: Thomson Video Equipment, Cergy Saint Christophe, France

[21] Appl. No.: 349,831

[22] Filed: May 10, 1989

[30] Foreign Application Priority Data

May 10, 1988 [FR] France ............................... 88 06281

[51] Int. Cl.⁵ ............................................. H04N 3/14
[52] U.S. Cl. ........................... 358/213.26; 358/213.11
[58] Field of Search ...................... 358/213.26, 213.13, 358/180, 140, 213.11; 357/24 LR

[56] References Cited

U.S. PATENT DOCUMENTS

| 4,167,754 | 9/1979 | Nagumo et al. | 358/213.26 |
| 4,280,141 | 7/1981 | McCann et al. | 358/213.26 |
| 4,291,241 | 9/1981 | Mayama et al. | 307/269 |
| 4,399,464 | 8/1983 | Hix et al. | 358/213.13 |
| 4,431,926 | 2/1984 | Mayumi | 307/260 |
| 4,644,405 | 2/1987 | Roy et al. | 358/213.26 |

OTHER PUBLICATIONS

Electronics International, vol. 50, No. 8, Apr. 1977, pp. 107–108, C. Bolon.: "De-Coders Drive Flip-Flops for Clean Multiphase Clock".
IBM Technical Disclosure Bulletin, vol. 22, No. 6, Nov. 1979, pp. 2301–2302, F. J. Aichelmann, Jr.: "Bypass Selection Mechanism for Defective Chips".
Electronic Design, vol. 29, No. 16, Aug. 6, 1981, pp. 183–190, A. P. King et al.: "Charge-Coupled Devices Tackle TV Imaging".

Primary Examiner—Stephen Brinich
Attorney, Agent, or Firm—Oblon, Spivak, McClelland, Maier & Neustadt

[57] ABSTRACT

This circuit is essentially formed by a circuit of the programmable (preferably reprogrammable) logic component type, receiving, at input, a reference clock signal (CK) and configured in such a way as to deliver, at output, the plurality of clock signals ($\phi 1 \ldots \phi N$) needed to control the charge transfer device. It is, notably, a programmable logic circuit configured so as to include, around a common general bus:

first synchronized signals generating means receiving, at input, said clock signal, and applying, at output, to the general bus, a sequence of first binary configurations representing the horizontal sequencing of the charge transfer device;

second synchronized signals generating means receiving, at input, a signal corresponding to the appearance of a particular binary configuration among said first binary configurations, and applying, at output, to the general bus, a sequence of second binary configurations, representing the vertical sequencing of the charge transfer device, and a plurality of sequencing means placed in parallel on the general bus, said sequencing means receiving, at input, the signals present at the general bus, and decoding these signals so as to respectively generate, at a given instant which is a function of said binary configurations and of said clock signal, one of said control logic signals.

4 Claims, 2 Drawing Sheets

LOGIC SIGNALS GENERATING AND SEQUENCING CIRCUIT FOR CHARGE TRANSFER DEVICE

BACKGROUND OF THE INVENTION

1. Field of the Invention

The present invention concerns a logic signals generating and sequencing circuit for charge transfer devices, notably charge-coupled devices.

2. Description of the Prior Art

In order to be driven, charge transfer devices need to receive a relatively large number of control logic signals with well-adapted temporal sequencing, as regards both the respective instants when the pulses, forming these logic signals, are produced and the respective phases of these pulses.

These control logic signals are used notably to achieve the transfer of charges within the matrix sensor (horizontal transfer, vertical transfer, transfer from the image plane to the memory plane etc.), the delivering of the output signal at a precise rate and as a function of an external synchronizing signal, zero-setting operations, etc. It is these signals that shall hereinafter be designated by the general term: "control logic signals".

The number and characteristics of these signals depend both on the class of sensor used (frame transfer sensor, row transfer sensor etc.) and, within one and the same class of sensor, on the driving mode used to transfer the charges. This driving mode may vary very greatly between one manufacturer and another and even, for one and the same manufacturer, between one reference of a circuit and another.

Until now, these control logic circuits were produced by a set of specialized circuits, the diagram of which is shown in a simplified way in FIG. 1.

A clock 1, generally a quartz crystal clock, produces a clock signal referenced CK, of the order of 8 to 15 MHz, applied to a synchronized signals generator 2 which also receives an external synchronization pulse SYN designed for the synchronization of successive frames, this signal SYN generally being a 50 or 60 Hz signal.

The output signal of the synchronized signals generator 2 is applied, in input, to a sequencing control circuit 3 which produces the different logic control signals $\phi 1$ ... $\phi N$ needed to drive the charge transfer device 4 through a driver stage 5 which provides for the matching of the voltage and current levels as a function of the needs of the charge transfer device.

For, the sequencing control generally produces TTL type signals, namely signals for which the two logic levels correspond to 0 and 5 volts. These voltages are not those needed by the sensor to work. Furthermore, the current drawn by the sensor is generally far greater than the possibilities of the sequencing logic circuit which is usually a MOS technology circuit.

Moreover, as charge transfer devices generally have a number of defective pixels, the defects are corrected so as to make them invisible (for example by reproducing, for the defective pixel, the voltage level corresponding to the illumination of the immediately preceding pixel).

This correction is made, upon command from the sequencing circuit 3, by the circuit 6 which processes the video signal given at the output of the sensor 4. To this effect, the positions of the defective pixels have been previously stored in an external memory 7, generally a PROM delivered at the same time as the sensor, the defects of which it memorizes.

The sequencing control circuit 3 is connected to the PROM 7 by an address bus and a data bus and, at each row, it interrogates the PROM to find out whether there is a defect on this row and, if so, to ascertain the horizontal position of this defective pixel. It will then, at the requisite instant, deliver the signal COR to the video processing circuit 6 (it will be noted, in this respect, that it is possible in this way to memorize only one defective pixel per row; this is generally enough, but necessitates the removal, in a preliminary sorting-out operation, of those sensors that do not meet this condition).

These prior art circuits have a number of drawbacks.

First of all, as will be easily understood, the sequencing control circuit is a circuit specific to a particular sensor (for example, a sensor of the Sony ICX021L type, the corresponding sequencing control circuit will be the CX23047A, associated with a synchronized signals generator CX7930 and a PROM MB6052).

It is thus seen that, since these are dedicated components, as many different types of synchronizing and rate-setting cards are required as there will be different types of sensors used.

Furthermore, at the level of the sensor, these cards are relatively bulky inasmuch as it is necessary to provide for several different discrete circuits (circuits 2, 3 and 7) with their respective interconnections.

Moreover, it would not be possible to combine the circuits 2, 3 and 7 in a single integrated component because the memory 7 contains a specific programming associated with a given copy of a sensor, and it is always necessary for the PROM to remain separate from the rest of the circuit, so that it can be exchanged if, for example, the sensor is exchanged.

SUMMARY OF THE INVENTION

The present invention proposes to overcome these drawbacks, by proposing a logic signals generating and sequencing circuit for charge transfer devices which not only integrates, into a single package, the various functions needed to drive the charge transfer device, but is also of universal design, i.e. unlike the dedicated circuits of the prior art, the circuit of the present invention is compatible with almost all existing sensors.

Through this particularly advantageous characteristic, it is possible to have only one sequencing/video processing card, irrespectively of the sensor used, with only the voltages and currents matching stage (driver circuit 5 in FIG. 1), being specific to the sensors.

Furthermore, within one and the same range of sensors, it is possible to change from one given sensor to another (for example from a 650-pixels/row sensor to a more efficient, 750 pixels/row sensor) without in any way having to change the card carrying the generating and sequencing circuit: it will suffice to reprogram this card depending on the new characteristics of the sensor used.

In this respect, it can also be noted that, with the circuit of the invention, it is possible to retrieve an advantage formerly obtained in cameras with tubes, namely the possibility of changing the type of tubes without having to change the associated frame and row synchronization circuits.

To this effect, according to the invention, there is proposed a logic signals generating and sequencing circuit for a charge transfer device, having an input designed to receive a reference clock signal (CK) comprising means to generate synchronized logic signals, said generating means being connected to means for the sequencing of these logic signals so as to deliver, at output, the plurality of clock control logic signals ($\phi1 \ldots \phi N$) needed for the control of the charge transfer device, wherein the generation and sequencing means are integrated into a single component of the programmable (preferably, erasable programmable) logic component type, the programming of the component being done as a function of the characteristics of the charge transfer device used.

Advantageously, the programmable logic component is configured so as to include, around a common general bus:

first synchronized signals generating means receiving, at input, said clock signal, and applying, at output, to the general bus, a sequence of first binary configurations representing the horizontal sequencing of the charge transfer device;

second synchronized signals generating means receiving, at input, a signal corresponding to the appearance of a particular binary configuration among said first binary configurations, and applying, at output, to the general bus, a sequence of second binary configurations, representing the vertical sequencing of the charge transfer device, and a plurality of sequencing means placed in parallel on the general bus, said sequencing means receiving, at input, the signals present at the general bus, and decoding these signals so as to respectively generate, at a given instant which is a function of said binary configurations and of said clock signal, one of said control logic signals.

Very advantageously, the generating and sequencing circuit further has means for detecting defects, said means receiving, at input, the signals present at the general bus, and decoding these signals so as to generate, for certain pre-defined combinations corresponding to positions of defective pixels of the charge transfer device, a defect correction signal delivered to the circuit that processes the video signal produced at the output of the charge transfer device.

Owing to this latter characteristic, it is no longer necessary, as was the case earlier, to have a fixed sensor/defect memory unit. For a given copy of a sensor, it will be simply enough to program the generating and sequencing circuit (or to reprogram it if there is to be just a change of sensor) as a function of the localization of the defects, these defects being managed directly by the sequencing control circuit, and not by repeated interrogation of an external memory.

BRIEF DESCRIPTION OF THE DRAWINGS

Other characteristics and advantages will emerge from the following detailed description, made with reference to the appended drawings, of which.

the above-mentioned

DESCRIPTION OF THE PREFERRED EMBODIMENT

According to the present invention, the generating and sequencing circuit is essentially formed by a circuit of the programmable logic type, very advantageously of the reprogrammable type, said component being more commonly known as a PLD (programmable logic device) or EPLD (erasable programmable logic device).

These circuits have a certain number of pre-diffused logic functions or "macrocells" comprising standard logic functions, such as flip-flops, gates, etc. These macrocells are then mutually configured by the user by means of EPROM transistors programmed so as to make the desired logic connections (the term "programmable" shall be understand herein in the usual sense of "recordable", given to it in EPROM or EEPROM technology. This term should not evoke any microprogrammed logic, but only a wired logic configured in a certain way by selective recording of certain items of data defining the logic configuration which the circuit should have).

An internal "general bus", to which all the macrocells may be connected, enables them to communicate with one one another and with the input/output ports of the component.

A circuit of this type, suitable for the implementation of the invention, is for example, the EP1800, by Altera, which is a circuit with 48 macrocells, each including a flip-flop and a set of elementary logic functions for a total of 2100 equivalent gates.

However, this component is given purely by way of illustration and, in general, it would be equally possible to use any type of programmable logic component having at least 1500 equivalent logic gates and at least 40 RS flip-flops. If it is desired to incorporate the defect-detection function in the circuit of the invention, the programmable logic component should be of the reprogrammable type.

We shall now describe the functional structure according to which the programmable logic component is configured.

Figure 2:
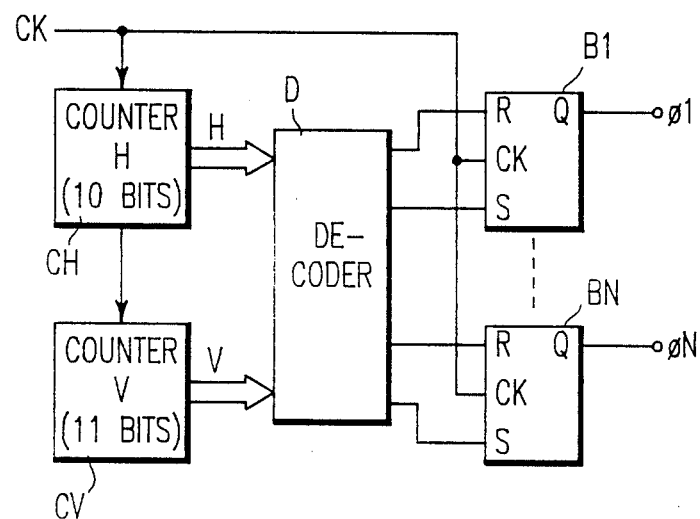
FIG. 2 illustrates the basic diagram according to which the circuit of the present invention works.

The essential principle is the one shown in FIG. 2. The clock pulses CK, produced by the external clock, are applied to a first counter CH designed to ensure the horizontal sequencing of the frame scanning of the sensor. This register is, for example, a 10-stage register which therefore delivers, at output, a first binary configuration, (symbolized by the bus H) which can assume 1024 different states.

An output of this first counter CH, corresponding to the end-of-row configuration, drives a second counter CV designed to ensure the vertical sequencing of the frame scanning of the sensor. This second counter CV is, for example, an 11-stage counter, which therefore delivers, at output, a second binary configuration (symbolized by the bus V) that can assume 2048 different stages.

The two logic configurations H and V are decoded by a decoder stage D which enables the control of the positioning and unpositioning of a series of flip-flops B1 ... BN, the outputs of which will form the logic signals $\phi 1 \ldots \phi N$ for the driving of the charge transfer device (the exact number of outputs $\phi 1 \ldots \phi N$ depends, in fact, on the type of component used). These control logic signals $\phi 1 \ldots \phi N$ typically comprise the clock signals for vertical and horizontal transfer (requiring two or four signals depending on the components) and the clock signals for the zero-setting of the output stage. Other logic signals may be planned, as necessary, depending on the different particular cases.

Figure 3:
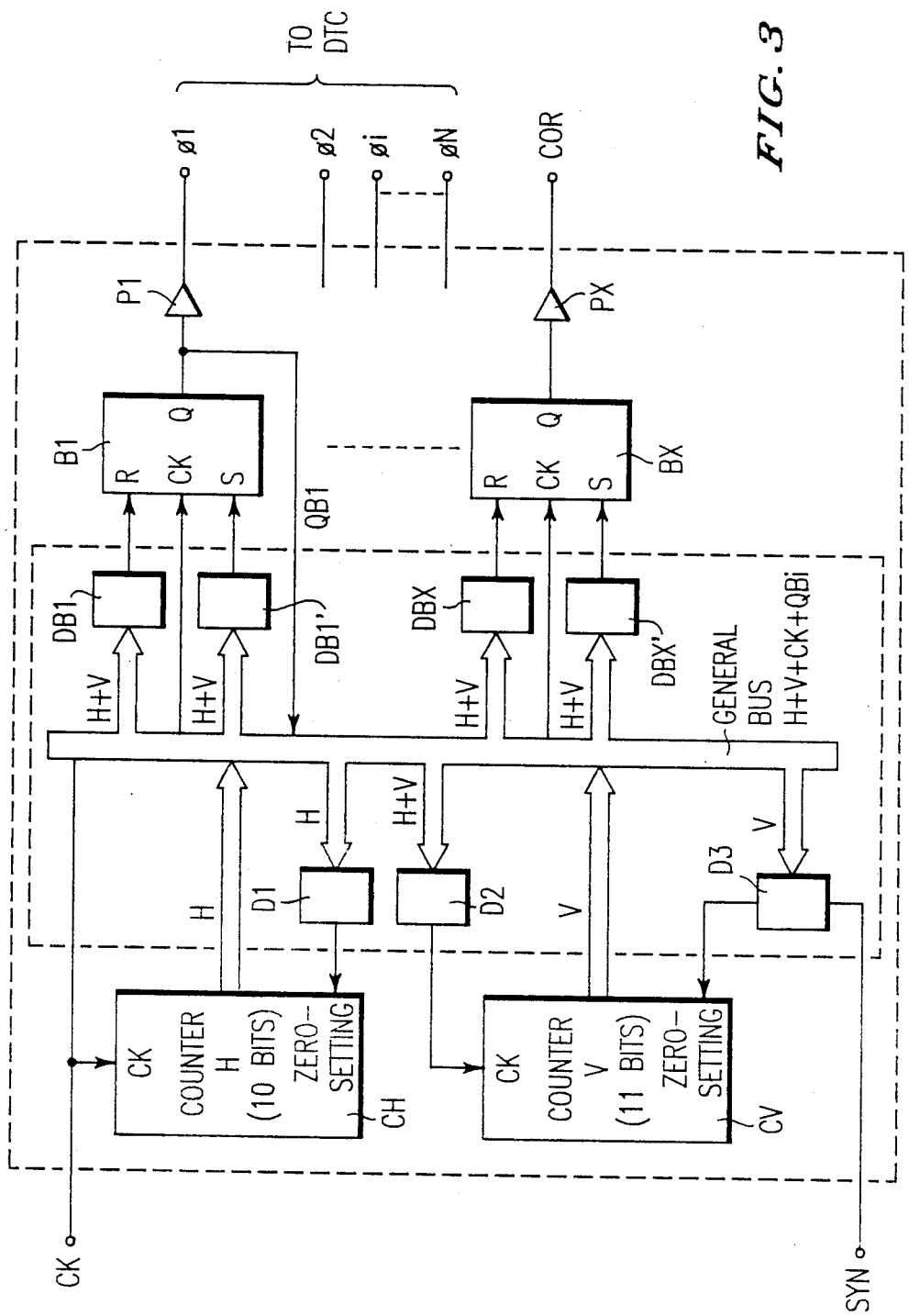
FIG. 3 shows the internal organization of a circuit according to the present invention.

FIG. 3 gives a more precise view of the way in which the circuit of FIG. 2 is arranged within a circuit of the programmable logic component type.

This figure again shows the two counters CH and CV which deliver the binary configurations H and V on a general bus common to all the macrocells of the programmable logic component.

The horizontal synchronization counter H is zero-set by a pulse delivered at each row end by a decoder stage D1. Since the decoder stage D1 is programmed as a function of the number of pixels per row, it is seen that, if the sensor is exchanged for a sensor having a greater number of pixels per row, it is enough to modify the programming of this decoder stage D1, without any other change.

The vertical synchronization counter CV is driven, at its clock input, by the output of a decoder D2, in response to each start of the new row, and it is zero-set by a decoder D3, in response to each frame end (as a function of the number of rows per frame) and also of the external synchronization signal SYN.

The different flip-flops B1 ... BN are monitored at each of their R and S inputs by a detector stage DB1, DB1' ..., analyzing the signals present at the general bus and receiving, at its input CK, the clock pulses which also transit through the general bus.

The outputs Q of the flip-flops are applied, through a matching stage P1, ..., to the different clock inputs $\phi 1$ ..., $\phi N$ of the charge transfer device.

The outputs Q of the flip-flops are also applied to specific rows of the bus, so as to provide perfect synchronization of the different signals, in keeping to their respective phases with exactness.

Figure 1:
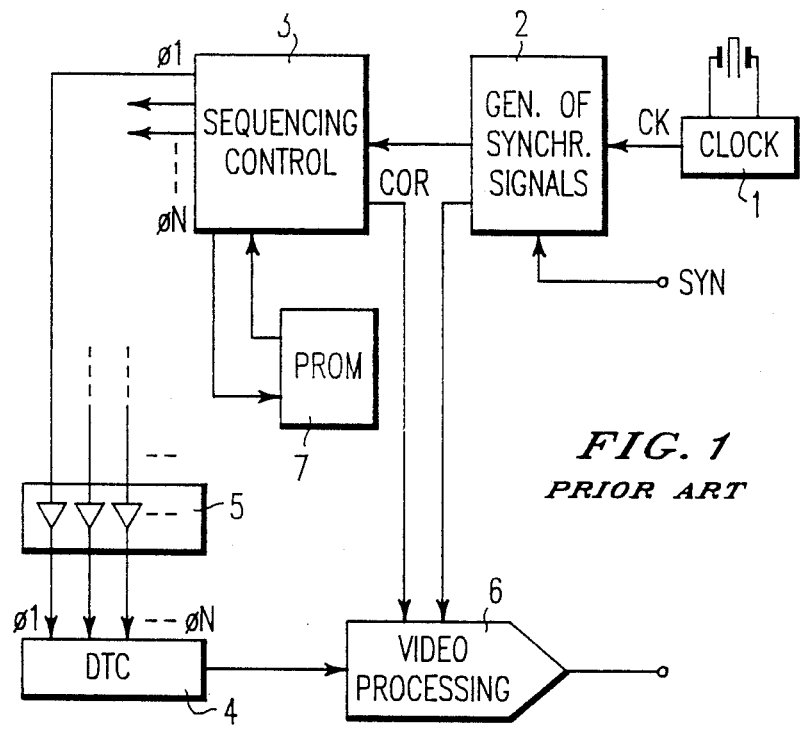
FIG. 1 shows the general configuration of the driving circuits of a charge transfer device, in the prior art configuration.

Very advantageously, there is also provision for an additional stage, comprising a flip-flop BX and associated decoders DBX, DBX' which deliver, to the video processing circuit (the circuit 6 of FIG. 1), through the stage BX, a signal COR for the correction of defects.

In this case, the detectors DBX and DBX' are programmed in a specific way for each copy of a sensor, depending on the positions of the previously identified defective pixels (with the difference of the decoders D1, D2, D3 and DB1, DB1' ... DBN, DBN', which depend only on the type of sensor and are, therefore, programmed in the same way for all the copies of one and the same type of sensor).

If the programmable logic component is reprogrammable, it will suffice to reprogram it in the event of replacement of a defective sensor, with neither modification nor exchange of any component.

This will also be the case if, within one and the same class of sensors, a sensor of a given type is replaced by a sensor of another type which is more efficient (for example, having a greater horizontal definition), just as was done formerly for cameras with tubes, where there was no need to modify the synchronization circuits if the tube was replaced.

What is claimed is:

1. A logic signals generating and sequencing circuit for a charge transfer device, said generating and sequencing circuit comprising:
   a programmable logic device component wherein said programmable logic device component further includes an input designed to receive a reference clock signal and wherein said programmable logic device component is configured as a function of the electrical characteristic of said charge transfer device and wherein said configuration of said programmable logic device component provides, at an output, a plurality of clock control logic signals fed to said charge transfer device whereby said charged transfer device is controlled.

2. The generating and sequencing circuit of claim 1, wherein the programmable logic component is configured so as to include, around a common general bus:
   first synchronized signals generating means receiving, at input, said clock signal, and applying, at output, to the general bus, a sequence of first binary configurations representing the horizontal sequencing of the charge transfer device;
   second synchronized signals generating means receiving, at input, a signal corresponding to the appearance of a particular binary configuration among said first binary configurations, and applying, at output, to the general bus, a sequence of second binary configurations, representing the vertical sequencing of the charge transfer device, and
   a plurality of sequencing means placed in parallel on the general bus, said sequencing means receiving, at input, the signals present at the general bus, and decoding these signals so as to respectively generate, at a given instant which is a function of said binary configurations and of said clock signal, one of said control logic signals.

3. The generating and sequencing circuit of claim 2, wherein the programmable logic component further comprises means for detecting defects, said means receiving, at input, the signals present at the general bus, and decoding these signals so as to generate, for certain pre-defined combinations corresponding to positions of defective pixels of the charge transfer device, a defect correction signal delivered to the circuit that processes the video signal produced at the output of the charge transfer device.

4. The generating and sequencing circuit of any of the claims 2 or 3, wherein the programmable logic component is an erasable, programmable logic component.

* * * * *